(12) United States Patent
Kim

(10) Patent No.: US 9,627,444 B2
(45) Date of Patent: Apr. 18, 2017

(54) FINE METAL MASK AND METHOD OF MANUFACTURING THE SAME

(71) Applicant: SAMSUNG DISPLAY CO., LTD., Yongin, Gyeonggi-do (KR)

(72) Inventor: Jung-Hoon Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 228 days.

(21) Appl. No.: 14/055,636

(22) Filed: Oct. 16, 2013

(65) Prior Publication Data

US 2014/0290574 A1 Oct. 2, 2014

(30) Foreign Application Priority Data

Mar. 29, 2013 (KR) ........................ 10-2013-0034579

(51) Int. Cl.
| | |
|---|---|
| *H01L 27/32* | (2006.01) |
| *C23F 1/02* | (2006.01) |
| *C23C 14/04* | (2006.01) |
| *H01L 51/52* | (2006.01) |
| *H01L 51/56* | (2006.01) |
| *G03F 7/00* | (2006.01) |
| *H01L 51/00* | (2006.01) |

(52) U.S. Cl.
CPC ............ *H01L 27/32* (2013.01); *C23C 14/042* (2013.01); *C23F 1/02* (2013.01); *H01L 51/5271* (2013.01); *H01L 51/56* (2013.01); *G03F 7/0015* (2013.01); *H01L 51/0011* (2013.01)

(58) Field of Classification Search
CPC ...... H01L 27/32; H01L 51/56; H01L 51/5271; H01L 51/0011; C23F 1/02; C23C 14/042; G03F 7/0015
See application file for complete search history.

(56) References Cited

U.S. PATENT DOCUMENTS

| | | | | | |
|---|---|---|---|---|---|
| 4,861,422 | A | * | 8/1989 | Kudou | .................... H01J 9/142 |
| | | | | | 134/34 |
| 5,268,068 | A | * | 12/1993 | Cowell | .................... G03F 1/20 |
| | | | | | 216/100 |
| 5,326,663 | A | * | 7/1994 | Tanaka | .................... H01J 9/142 |
| | | | | | 216/12 |

(Continued)

FOREIGN PATENT DOCUMENTS

| | | |
|---|---|---|
| KR | 10-2007-0002553 A | 1/2007 |
| KR | 10-2007-0058058 A | 6/2007 |
| KR | 10-2005-0055828 A | 12/2013 |

*Primary Examiner* — Anita Alanko
(74) *Attorney, Agent, or Firm* — Robert E. Bushnell, Esq.

(57) ABSTRACT

A method of manufacturing a fine metal mask is provided. The method of manufacturing a fine metal mask includes: forming a first recessed portion in a first surface of a base member; forming an edge portion of the first recessed portion in a uniform depth; forming a second recessed portion in a second surface of the base member, the second surface being opposite to the first surface; and communicating the first recessed portion and the second recessed portion of the base member. A fine metal mask produced by the inventive method is also described and may be used to fabricate OLEDs having better resolution and an increased aperture ratio in comparison with OLEDs prepared using the fine metal masks of the conventional art.

13 Claims, 7 Drawing Sheets

(56) References Cited

U.S. PATENT DOCUMENTS

| | | | |
|---|---|---|---|
| 7,033,711 B2 | 4/2006 | Boroson et al. | |
| 7,198,726 B2 * | 4/2007 | Donaldson | B41J 2/14145 |
| | | | 216/27 |
| 8,404,125 B2 * | 3/2013 | Matsudate | C23C 14/042 |
| | | | 118/504 |
| 2003/0162402 A1 * | 8/2003 | Song | B81C 1/00087 |
| | | | 438/710 |
| 2005/0199580 A1 * | 9/2005 | Yang | C23C 14/042 |
| | | | 216/12 |
| 2006/0127690 A1 * | 6/2006 | Ueda | C23F 1/02 |
| | | | 428/596 |
| 2012/0252221 A1 * | 10/2012 | De Brabander | B81C 1/00103 |
| | | | 438/736 |
| 2013/0015444 A1 * | 1/2013 | Hirai | C23C 14/042 |
| | | | 257/57 |
| 2013/0071775 A1 * | 3/2013 | Prushinskiy | G03F 1/76 |
| | | | 430/5 |
| 2013/0133573 A1 | 5/2013 | Joo et al. | |
| 2014/0220715 A1 * | 8/2014 | Kang | C23C 14/042 |
| | | | 438/26 |
| 2014/0356769 A1 * | 12/2014 | Prushinskiy | G03F 1/80 |
| | | | 430/5 |
| 2015/0040826 A1 * | 2/2015 | Jung | C23F 1/02 |
| | | | 118/504 |
| 2015/0159283 A1 * | 6/2015 | Tsai | C23F 1/02 |
| | | | 118/504 |

\* cited by examiner

FINE METAL MASK AND METHOD OF MANUFACTURING THE SAME

CLAIM OF PRIORITY

This application makes reference to, incorporates the same herein, and claims all benefits accruing under 35 U.S.C. §119 from an application for FINE METAL MASK AND METHOD OF MANUFACTURING THE SAME, earlier filed in the Korean Intellectual Property Office on Mar. 29, 2013, and there duly assigned Serial No. 10-2013-0034579.

BACKGROUND OF THE INVENTION

Field of the Invention

The present invention relates to a fine metal mask and a method of manufacturing the same.

Description of the Related Art

In display devices, an organic light emitting diode (OLED) display offers the advantages of a wide viewing angle, excellent contrast and fast response speed. In such an OLED display, several subpixels form a pixel. In a process of manufacturing an OLED display, each subpixel may be formed by several methods, and one method thereof is a deposition method.

In order to form a subpixel using a deposition method, a fine metal mask (FMM) having the same pattern as that of a thin film to be formed is aligned on a substrate. In the fine metal mask, penetration portions are formed corresponding to a pattern. By depositing an organic material on a substrate with such a fine metal mask, a thin film of a desired pattern is formed.

In conventional methods of manufacturing a fine metal mask, the penetration portions that make up the desired pattern have generally been prepared by individually etching a first surface of a base member and a second surface of the base member, the second surface being opposite to the first surface, allowing holes etched in the first surface to communicate with holes etched in the second surface. In a conventional fine metal mask that is produced by such a method, an unwanted lip, or curb, may remain on the inside of the penetration portion opening in the base member. Such a protruding curb may undesirably impact the shapes of the deposited areas of organic film. Because the angle of deposition may vary when the fine metal mask is used to form organic thin films, protruding curbs within the openings in the fine metal mask may reduce the sharpness with which the edges of the films are deposited. Furthermore, in its location on the inside of the penetration portion of the metal mask, the curb may be difficult to remove.

The above information disclosed in this Background section is only for enhancement of understanding of the background of the invention and therefore it may contain information that does not form the prior art that is already known to a person of ordinary skill in the art.

SUMMARY OF THE INVENTION

The present invention has been made in an effort to provide a fine metal mask and a method of manufacturing the same. The manufacturing method of the present invention has the advantage of being capable of reducing a height of a curb, or protruding lip portion, that may circle the interior of a penetration portion (hole) in a fine metal mask in comparison with the curb height generally seen in the conventional art.

An exemplary embodiment of the present invention provides a method of manufacturing a fine metal mask, the method including: forming a first recessed portion in a first surface of a base member; forming an edge portion of the first recessed portion in a uniform depth; forming a second recessed portion in a second surface of the base member, the second surface being opposite to the first surface; and communicating the first recessed portion and the second recessed portion of the base member.

The step of forming an edge portion of the first recessed portion may include filling the first recessed portion with a first positive photoresist; disposing a halftone mask at a first surface of the base member; and removing an edge portion of the first positive photoresist to a predetermined depth by exposing the first recessed portion to light through the halftone mask.

The halftone mask may include a first portion corresponding to the edge portion of the first positive photoresist, the first portion of the halftone mask transmitting light; and a second portion corresponding to a central portion of the first positive photoresist, the second portion of the halftone mask not transmitting light.

The step of forming an edge portion of the first recessed portion may further comprise etching an inside of the first recessed portion in the base member to the predetermined depth. A first photoresist pattern may be formed on the first surface of the base member prior to the formation of the first recessed portion and may serve as a mask during the etching steps that shape the first recessed portion. A developer may be used to remove positive photoresist that has been exposed to light; a developing step may precede the step of etching the base member material to the predetermined depth.

The step of forming a first recessed portion may include forming a first photoresist pattern at the first surface of the base member; and etching the first surface of the base member using the first photoresist pattern as a mask.

The step of forming a second recessed portion may include forming a second photoresist pattern at the second surface of the base member; and etching the second surface of the base member using the second photoresist pattern as a mask.

The method may further include filling the first recessed portion with a second positive photoresist before the step of communicating the first recessed portion and the second recessed portion.

The first recessed portion may be formed at a lower surface (first surface) of the base member, and the second recessed portion may be formed at an upper surface (second surface) of the base member, the lower surface being understood to be the surface of the base member of the mask that interfaces with the OLED substrate when the mask is in use.

Another embodiment of the present invention provides a fine metal mask including: a base member that is formed in a plate form; and a penetration hole that is formed to penetrate the base member, the penetration hole including a first portion having an internal diameter that narrows in a direction approaching the second portion, the second portion having a constant internal diameter.

The base member may have a first planar surface and a second planar surface, the second planar surface being opposite to the first planar surface. An interior wall surface forming the second portion of the penetration hole may be perpendicular to at least one of the first planar surface and the second planar surface.

In a fine metal mask that is produced by a method of manufacturing a fine metal mask according to an exemplary embodiment of the present invention, a height of a curb of the inside of a penetration hole may be smaller than that of a curb of a penetration portion of a fine metal mask produced according to a conventional method. In this way, as a height of a curb is reduced, a width of an edge portion of a deposited organic layer that is affected by the curb may be smaller than the corresponding affected edge portion width of an organic layer deposited with a conventional fine metal mask.

As a fine metal mask according to an exemplary embodiment of the present invention has a curb width smaller than that of a conventional fine metal mask, it is further advantageous in producing an OLED display of a high resolution. The edges of the organic thin films deposited using the fine metal mask of the present invention may be defined more sharply than the edges of organic thin films deposited using fine metal masks prepared according to the conventional art.

Further, when depositing an organic film on a substrate using a fine metal mask according to an exemplary embodiment of the present invention, an area over which an organic film is uniformly deposited on a substrate increases, compared with the area of an organic film deposited on a substrate with a conventional fine metal mask. This is accomplished by forming penetration holes in the fine metal mask that have a different shape in vertical cross section in comparison with penetration holes in the fine metal masks of the conventional art. Accordingly, because an aperture ratio of an OLED display can be improved (increased) in this way, the fine metal mask of the present invention is further advantageous in allowing the fabrication of OLED display devices that operate with lower currents, consume less power and have lower operating temperatures and therefore have improved lifespans in comparison with OLED display devices fabricated with fine metal masks of the conventional art.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings in which like reference symbols indicate the same or similar components, wherein:

FIG. 2 is a cross-sectional view illustrating a state in which a first photoresist pattern is formed at a first surface of a base member and in which a second photoresist pattern is formed at a second surface thereof.

FIG. 3 is a cross-sectional view illustrating a process of forming a first recessed portion by primarily etching the first surface of the base member.

FIG. 4 is a cross-sectional view illustrating a state in which a first positive photoresist is filled in the first recessed portion.

FIG. 5 is a cross-sectional view illustrating a process of exposing the first positive photoresist to light using a halftone mask.

FIG. 6 is a cross-sectional view illustrating the shape of the remaining first positive photoresist formed by exposing the first positive photoresist to light and developing.

FIG. 7 is a cross-sectional view illustration a state at the outset of the step of etching the inside of the first recessed portion on which the first positive photoresist is located.

FIG. 8 is a cross-sectional view illustrating the first recessed portion formed by etching the inside of the first recessed portion.

FIG. 9 is a cross-sectional view illustrating a process of forming a second recessed portion by etching the second surface of the base member.

FIG. 10 is a cross-sectional view illustrating a process of communicating the first recessed portion and the second recessed portion of the base member.

DEFINITIONS

Figure 1:
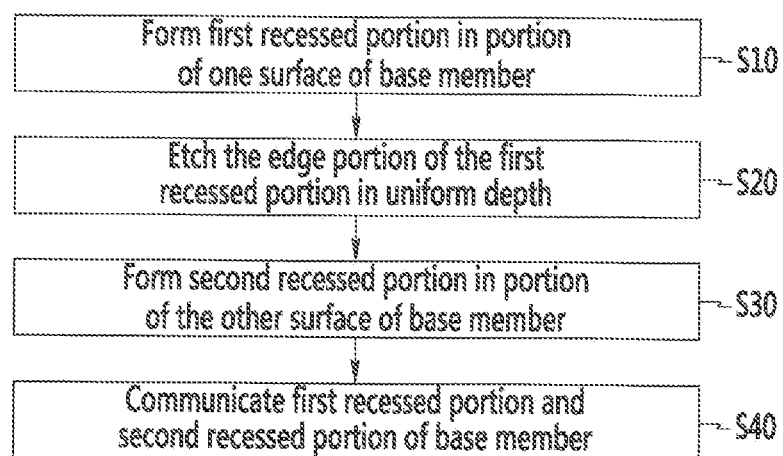
FIG. 1 is a flowchart sequentially illustrating a method of manufacturing a fine metal mask according to an exemplary embodiment of the present invention.

Aperture ratio: The ratio between the transmissive portion of the area of a subpixel or pixel and the total area of deposition of an organic film associated with the subpixel or pixel.

Base member: A metal part capable of encompassing openings through which organic materials may be deposited to form an organic thin film of an OLED.

Curb: A protruding lip or edge found in the interior of openings in a fine metal mask used for deposition of organic thin films in the fabrication of OLEDs.

Etch: To remove or wear away.

Etchant: Material capable of dissolving or removing another material through a process of attrition.

Halftone mask: A mask comprising regions that block light transmission to varying degrees.

Penetration portions: Openings in a base member of a fine metal mask.

Photoresist: A material that, upon exposure to light, either acquires or loses resistance to attack by an etchant.

Pixel: One of many areas of light emission from which a display image is composed.

Positive photoresist: A photoresist that, upon exposure to light, loses resistance to attack by an etchant.

Resolution: A measure of the fineness of detail that may be conveyed by a displayed image.

Subpixel: Subdivision of a pixel.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in several exemplary embodiments, the same constituent elements are denoted by the same reference numerals and are described only in a representative first exemplary embodiment, and, in other exemplary embodiments, only constituent elements different from those of the first exemplary embodiment will be described.

The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

FIG. 1 is a flowchart sequentially illustrating a method of manufacturing a fine metal mask according to an exemplary embodiment of the present invention.

Referring to FIG. 1, a method of manufacturing a fine metal mask according to an exemplary embodiment of the present invention may include a step of forming a first recessed portion in a portion of a first surface of a base member (S10), a step of etching the base member to form an edge portion of the first recessed portion in a uniform depth (S20), a step of forming a second recessed portion in a second surface of a base member, the second surface being opposite to the first surface (S30), and a step of communicating the first recessed portion and the second recessed portion of a base member (S40).

Hereinafter, each step of a method of manufacturing a fine metal mask according to an exemplary embodiment of the present invention will be described in detail with reference to the drawings. It is described that the first recessed portion is formed at a first surface of the base member and the second recessed portion is formed at a second surface of the base member. The first surface of the base member, which may also be termed a lower surface of the base member, may be distinguished as being the surface of the base member that contacts an OLED substrate when a finished fine metal mask is used for the deposition of an organic thin film onto the OLED substrate. Accordingly, the second surface of the base member may also be termed an upper surface of the base member. The terms "lower surface" and "upper surface" need not imply any particular orientation relative to the surface of the Earth.

FIGS. 2 to 10 are cross-sectional views illustrating each step of a method of manufacturing a fine metal mask according to an exemplary embodiment of the present invention.

Figure 2:
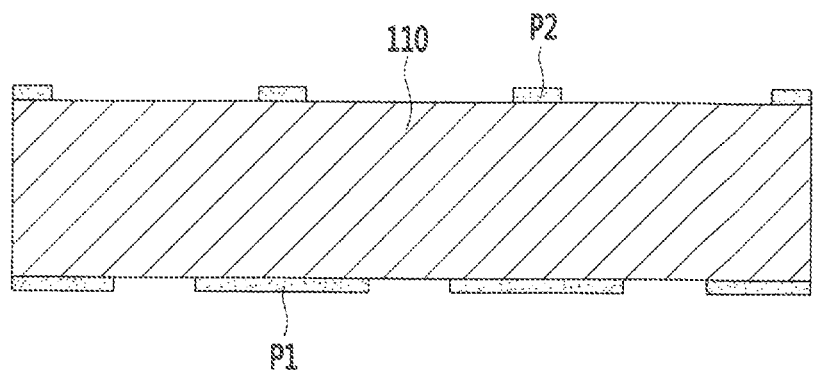
FIGS. 2 to 10 are cross-sectional views illustrating each step of a method of manufacturing a fine metal mask according to an exemplary embodiment of the present invention.
Figure 3:
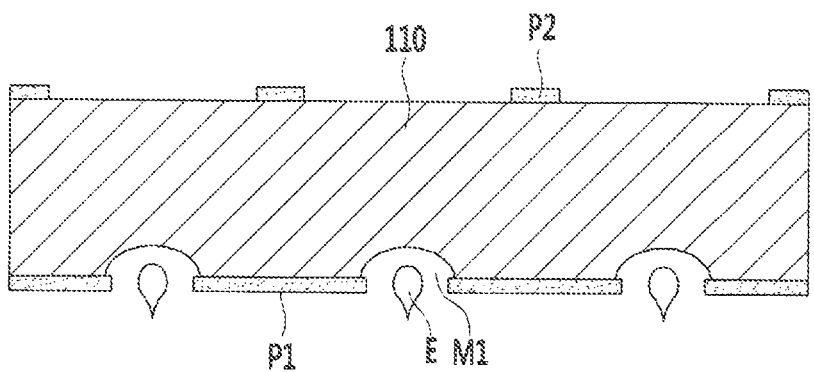

FIG. 2 is a cross-sectional view illustrating a state in which a first photoresist pattern P1 is formed at a first surface of a base member 110 and in which a second photoresist pattern P2 is formed at a second surface of base member 110, and FIG. 3 is a cross-sectional view illustrating a process of forming a first recessed portion M1, primarily by etching a lower portion of the base member 110.

Referring to FIGS. 2 and 3, the step of forming the first recessed portion M1 in one surface of the base member 110 (step S10, see FIG. 1) will be described in detail. Step S10 may include the step of forming the first photoresist pattern P1 at a first surface of the base member 110 and the step of etching the first surface of the base member 110 using the first photoresist pattern P1 as a mask.

A method of forming the first photoresist pattern P1 at a first surface of the base member 110 may include, for example, uniformly applying photoresist to a first surface of the base member 110, disposing a non-illustrated mask adjacent to first surface 110, and removing a portion of photoresist by radiating light from the outside of the mask, then washing with an appropriate developer solution.

In the step of etching the first surface of the base member 110 using the first photoresist pattern P1 as a mask, a part of the surface on which the first photoresist pattern P1 is not formed may be etched to a predetermined depth using wet etching with an etching liquid E. However, a method of etching a first surface of the base member 110 is not limited to wet etching.

Figure 4:
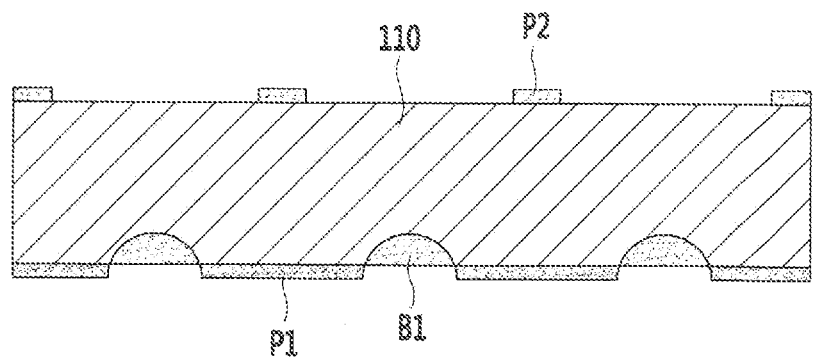
Figure 5:
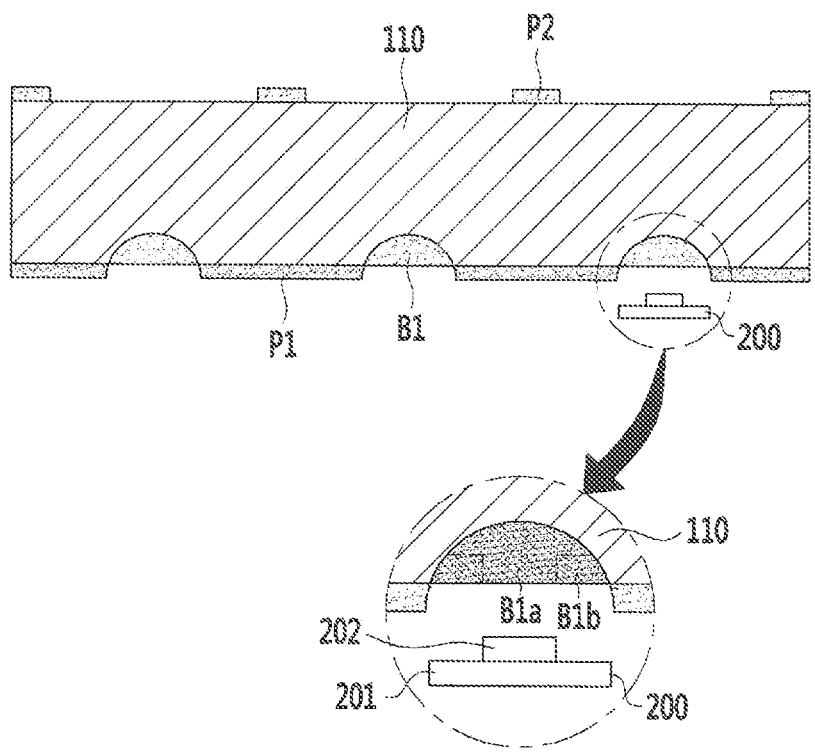
Figure 6:
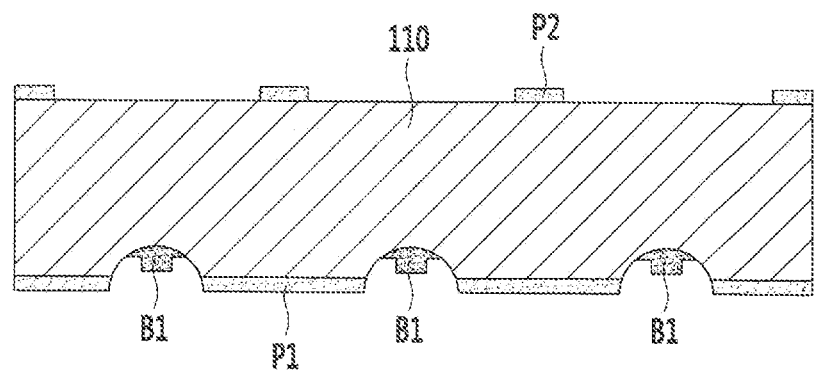

FIG. 4 is a cross-sectional view illustrating a state in which a first positive photoresist B1 is filled in the first recessed portion M1 (see FIG. 3), FIG. 5 is a cross-sectional view illustrating a process of exposing the first positive photoresist B1 to light using a halftone mask 200, and FIG. 6 is a cross-sectional view illustrating the shape of the first positive photoresist that remains after exposing the first positive photoresist B1 to light using a halftone mask 200 and treating the resulting surface with an appropriate developer solution.

Next, the step of forming the edge portion of the first recessed portion M1 (see FIG. 3) in a uniform depth (S20) (see FIG. 1) will be described in detail. As shown in FIG. 4, the first recessed portion M1 (see FIG. 3) is filled with the first positive photoresist B1. Here, the first positive photoresist B1 that is filled in the first recessed portion M1 (see FIG. 3) may be a positive photoresist that is used for masking purposes in general etching processes and, therefore, a detailed description thereof will be omitted.

As shown in FIG. 5, the halftone mask 200 is disposed adjacent to a first surface of the base member 110, and, by exposing the halftone mask 200 to light, the edge portion B1$b$ of the first positive photoresist B1 is rendered soluble in a developer solution and may be removed.

Here, the halftone mask 200 includes a first portion corresponding to the edge portion of the first positive photoresist, the first portion of the halftone mask transmitting light. Also, the halftone mask 200 includes a second portion corresponding to the central portion of the first positive photoresist, the second portion of the halftone mask not transmitting light.

A detailed structure of the halftone mask 200 may include, for example, a lower plate 201 and an upper plate 202. The lower plate 201 may be made of a material that transmits approximately 70% or more of light that is radiated from the outside.

The upper plate 202 may be made of a light blocking material. The upper plate 202 may be made of any one selected from silicide ($M_xSi_y$), chromium (Cr), silicon (Si), molybdenum (Mo), tantalum (Ta), titanium (TI), aluminum (Al), zirconium (Zr), indium (In), magnesium (Mg), hafnium (Hf), vanadium (V), neodymium (Nd), and germanium (Ge). The upper plate 202 is formed on the lower plate 201. The upper plate 202 is formed only in a central portion of the lower plate 201.

Referring to FIGS. 5 and 6, in the process of exposing the first positive photoresist to light through the halftone mask, the portion of the first positive photoresist that is shaded by the upper plate 202 of the halftone mask, upper plate 202 being made of a light blocking material, is the central portion B1$a$ of the first positive photoresist B1, and this shaded central portion is not removed in this light exposure step. The edge portion B1$b$ of the first positive photoresist B1 may be removed to a predetermined depth from the first surface of the base member 110 by exposure to light that is transmitted through the lower plate 201 of the halftone mask 200, followed by treatment with a developer solution. In this embodiment, the halftone mask 200 is formed with the lower plate 201 attached to the upper plate 202 (see FIG. 5), but the construction of the halftone mask 200 is not limited to this design and may use any structure in which part of the halftone mask area transmits light to peripheral portions B1$b$ of the first positive photoresist and the remaining areas of the halftone mask do not transmit light to the central portion B1a of the first positive photoresist.

Figure 7:
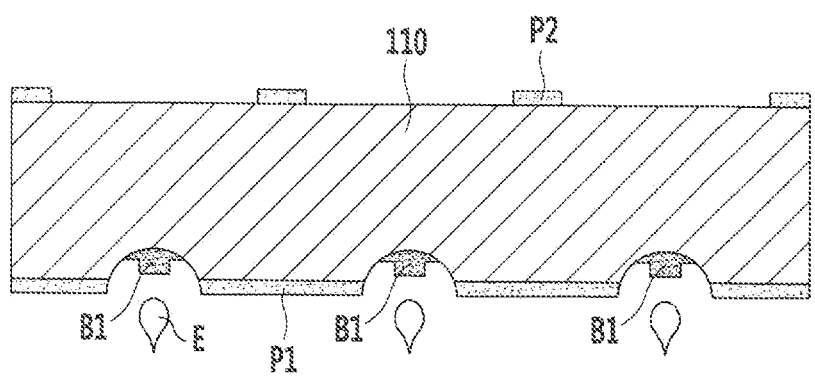
Figure 8:
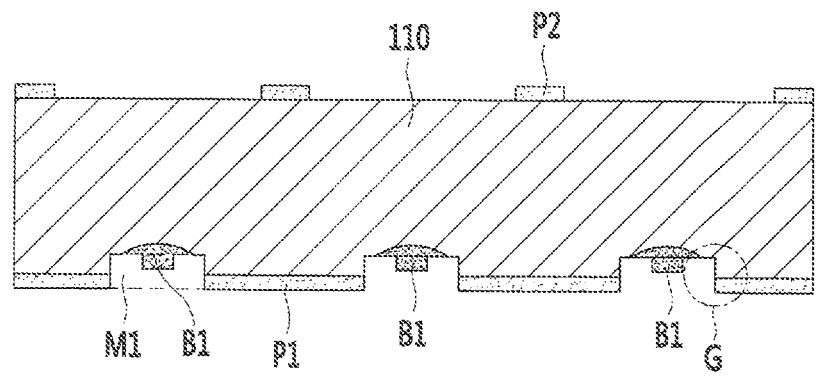

FIG. 7 is a cross-sectional view illustrating the process of etching the inside of the first recessed portion on which the first positive photoresist is located, and FIG. 8 is a cross-sectional view illustrating the result of etching the inside of the first recessed portion to a predetermined constant depth. As FIG. 8 shows, the lateral walls of the first recessed portion may be perpendicular to the first surface of the base member after performing this step.

Referring to FIG. 7, after the edge portion of the first positive photoresist B1 is removed by the halftone mask, an inside of the first recessed portion M1 is etched by an etching liquid E. The etching liquid E etches the base member 110 in the first recessed portion M1. Here, first positive photoresist B1 and first photoresist pattern P1 are used as masks in the process of etching.

Accordingly, as shown in an area G of FIG. 8, this etching is performed to a uniform depth from the first surface of the base member 110. An interior wall surface of the first recessed portion M1 may be formed to be perpendicular to at least one of the first surface and the second surface of the base member.

Returning to FIG. 3, a vertical cross section (a cross section taken perpendicular to the first surface of the base member) of the primarily etched first recessed portion M1 may have a circular arc shape. As shown in FIG. 8, the secondarily etched first recessed portion M1 may have a rectangular shape in vertical cross section.

Figure 9:
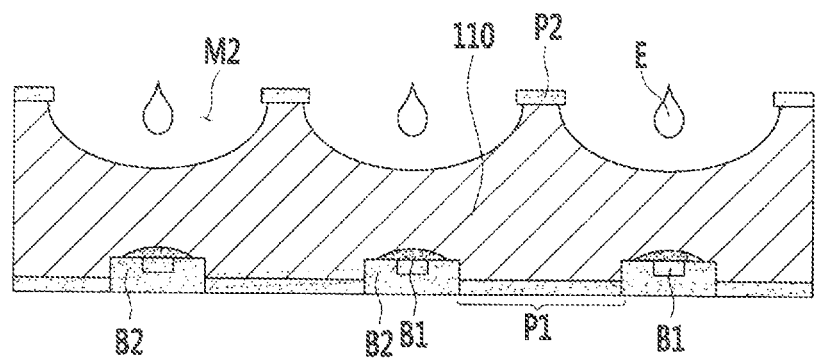

FIG. 9 is a cross-sectional view illustrating a process of forming a second recessed portion M2 by etching the second surface of the base member 110.

Referring to FIG. 9, an example of the step of forming the second recessed portion M2 (step S30, see FIG. 1) at the second surface of the base member 110 will be described in detail. The step of forming the second recessed portion M2 in a portion of the second surface of the base member 110 may include a step of forming a second photoresist pattern P2 on the second surface of the base member 110 and the step of etching the second surface of the base member 110 using the second photoresist pattern P2 as a mask.

In this way, the step of forming the second recessed portion M2 in a portion of the second surface of the base member 110 (step S30, see FIG. 1) may use a wet etching method by the etching liquid E and is similar to the step of forming the first recessed portion M1 in a portion of the first surface of the base member 110 (step S20, see FIG. 1). Therefore, a detailed description of the formation of second recessed portion M2 will be omitted.

Figure 10:
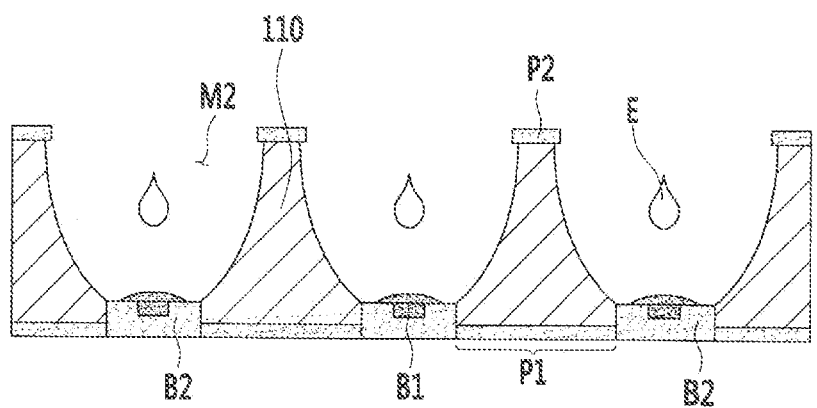

FIG. 10 is a cross-sectional view illustrating a process of communicating the first recessed portion M1 and the second recessed portion M2 of the base member 110.

Referring to FIG. 10, the step of communicating the first recessed portion M1 and the second recessed portion M2 of the base member 110 (step S40, see FIG. 1) is finally performed. In this step, by further etching of the second recessed portion M2 with the etching liquid E, the first recessed portion M1 and the second recessed portion M2 are communicated. After the step of communicating the first recessed portion M1 (see FIG. 8) and the second recessed portion M2 of the base member 110, the first photoresist pattern P1 and the second photoresist pattern P2 remaining at the first and second surfaces of the base member 110 may be removed.

A method of manufacturing a fine metal mask according to an exemplary embodiment of the present invention may further include the step of filling the first recessed portion M1 (see FIG. 8) with second photoresist B2.

The step of filling the first recessed portion M1 (see FIG. 8) with the second photoresist B2 may be performed before the step of communicating the first recessed portion M1 and the second recessed portion M2 of the base member 110 (step S40, see FIG. 1). In this way, by filling first recessed portion M1 with second photoresist B2, communicating M1 with M2, then removing the second photoresist B2 from the first recessed portion M1 (see FIG. 8) using a light exposure/developer solution wash sequence, the interior wall of the first recessed portion M1 (see FIG. 8), which was formed perpendicular to the first and second surfaces of the base member in previous process steps, can be prevented from being etched by the etching liquid E with loss of this favorable geometry. For example, the second photoresist B2 can be made of polymers that are inert to the etchant used to form M2. And the second photoresist B2 could be removed by another solvent or by ashing.

Accordingly, a shape of the first recessed portion M1 (see FIG. 8) can be formed in a functionally advantageous way. Here, the second photoresist B2 that is filled in the first recessed portion M1 (see FIG. 8) may be photoresist that is used generally in photolithography, and, therefore, a detailed description thereof will be omitted.

Hereinafter, a structure of the fine metal mask 100 according to an exemplary embodiment of the present invention, the structure being produced by the foregoing method of manufacturing a fine metal mask, will be described in detail.

Figure 11:
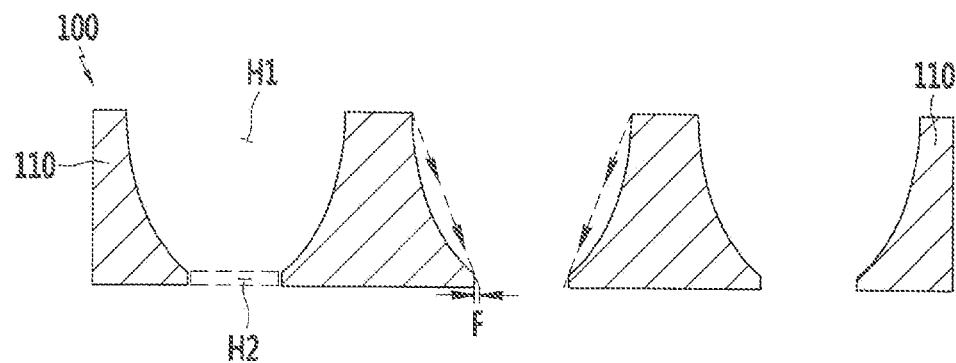
FIG. 11 is a cross-sectional view illustrating a fine metal mask according to an exemplary embodiment of the present invention.

FIG. 11 is a cross-sectional view illustrating a fine metal mask 100 according to an exemplary embodiment of the present invention.

Referring to FIG. 11, the fine metal mask 100 according to an exemplary embodiment of the present invention includes the base member 110 and penetration portions H1 and H2.

The base member 110 may be formed in a plate shape. The base member 110 becomes a body of the fine metal mask 100 when fine metal mask 100 is assembled. In an exemplary embodiment, the base member 110 may be formed in a rectangular band shape with one long dimension. The base members 110 of a rectangular band shape may be coupled in parallel in a tensioned state in a non-illustrated frame.

The penetration portions H1 and H2 may be formed to penetrate the base member 110. The penetration portions H1 and H2 may be formed in a pattern in the base member 110. The penetration portions H1 and H2 may be formed in a size to correspond to a subpixel of an OLED display. A general OLED display forms a group with a green light emitting subpixel, a blue light emitting subpixel, a red light emitting subpixel, light emission from the three subpixels combining in the human eye to represent a color. The penetration portions H1 and H2 each may be formed in a size similar to a size of one of the light emitting subpixels.

Here, it is described that the OLED display forms a group with a green light emitting subpixel, a blue light emitting subpixel, a red light emitting subpixel, light emission from the three subpixels combining in the human eye to represent a color, but this configuration is assumed for convenience of description. Those skilled in the art will understand that the meaning of the present description is preserved for additional embodiments that may include one of a white light emitting subpixel and a white light emitting pixel being added to the group and may include any single color light emitting subpixel being added to or subtracted from the group according to a desired design.

In exemplary embodiments, the penetration portions H1 and H2 may be formed with an upper portion H1 and a lower portion H2. The internal diameter of the upper portion H1 may become narrower in a direction toward its junction with lower portion H2. That is, a boundary portion between the upper portion H1 and the lower portion H2 may have the smallest internal diameter displayed by any portion of the combination of upper portion H1 and lower portion H2.

The lower portion H2 may be communicated with the upper portion H1, and the internal diameter at the junction of H1 and H2 may be maintained throughout the length of lower portion H2. That is, an interior wall surface 111 (see FIG. 12) forming the lower portion H2 may be perpendicular to at least one of the first surface or the second surface of the base member 110.

As described above, in a shape of a penetration portion of a conventional non-illustrated fine metal mask, because a shape of a vertical cross section of a lower portion is generally a half circle, the lower portion has a shape that features an internal diameter that widens in a direction toward the first surface of the base member. Accordingly, a boundary portion between an upper portion and a lower portion of the penetration portion may have the smallest internal diameter of the penetration portion in the conventional design. The "curb" discussed above may have disadvantageous effects on the deposition of an organic material through the conventional fine metal mask.

Figure 12:
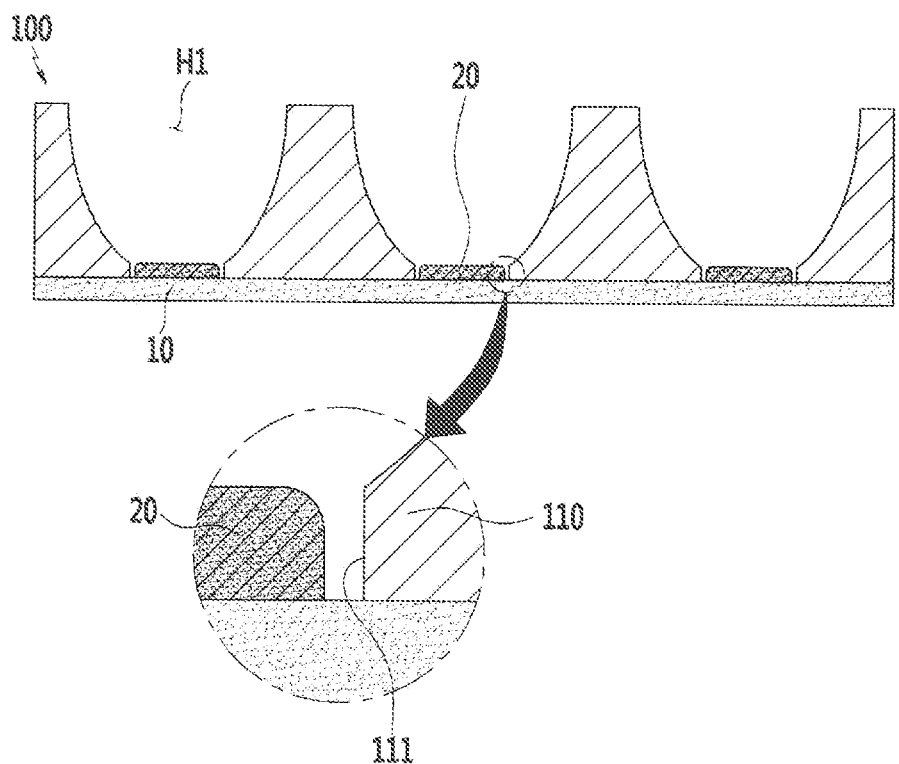
FIG. 12 is a cross-sectional view illustrating a process of depositing an organic material on a substrate with the fine metal mask of FIG. 11.

However, unlike a conventional fine metal mask, the fine metal mask 100 according to an exemplary embodiment of the present invention may feature a lower portion H2 of the penetration portion having a constant internal diameter and an internal surface 111 that is perpendicular to the first surface of the base member 110 (see FIG. 12). Therefore, an internal diameter of a boundary portion between the upper portion H1 and the lower portion H2 may be formed with the internal diameter of the lower portion H2. Accordingly, a height of a curb within the penetration holes H1 and H2 may be smaller than that of a curb of a penetration portion of a conventional fine metal mask. As an extent of protrusion of the curb is reduced, a width F of a projection of the curb upon an OLED substrate surface may be smaller than that of a conventional fine metal mask.

FIG. 12 is a cross-sectional view illustrating a process of depositing an organic material 20 on a substrate 10 with the fine metal mask 100 of FIG. 11.

As shown in FIG. 12, the fine metal mask 100 according to an exemplary embodiment of the present invention has a width F of a projection of the curb upon an OLED substrate surface that is smaller than that of a conventional fine metal mask, and thus the design of the present invention is advantageous in manufacturing an OLED display having a high resolution.

Further, when depositing the organic material 20 on the substrate 10 using the fine metal mask 100 according to an exemplary embodiment of the present invention, an area in which the organic material 20 is uniformly deposited on the substrate 10 remarkably increases in comparison with deposition of the organic material 20 on the substrate 10 with a conventional fine metal mask. Accordingly, in a process of manufacturing an OLED display, an aperture ratio can be increased and thereby improved in relation to the conventional art, and thus the design of the present invention is advantageous in improving a lifespan of the organic light emitting element.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 10: substrate | 20: organic material |
| 100: fine metal mask | 110: base member |
| 111: interior wall surface | 200: halftone mask |
| 201: lower plate | 202: upper plate |
| B1: first positive photoresist | B2: second photoresist |
| E: etching liquid | M1: first recessed portion |
| M2: second recessed portion | P1: first photoresist pattern |
| P2: second photoresist pattern | H1: upper portion of |
| H2: lower portion of penetration portion | penetration portion |
| F: width of projection of curb upon OLED substrate surface | |

What is claimed is:

1. A method of manufacturing a metal mask, the method comprising:
   forming a first recessed portion in a first surface of a base member, the base member having a second surface that is opposite to the first surface;
   after the formation of the first recessed portion, forming an edge portion of the first recessed portion, the edge portion being bounded by a third surface of the base member and an interior wall surface, the third surface being parallel to the first surface and being separated from the first surface by a constant depth, the interior wall surface being perpendicular to at least one of the first surface and the second surface of the base member;
   thereafter, forming a second recessed portion in the second surface of the base member; and
   communicating the first recessed portion and the second recessed portion of the base member.

2. The method of claim 1, the step of forming an edge portion of the first recessed portion comprising:
   filling the first recessed portion with a first positive photoresist;
   disposing a halftone mask at the first surface of the base member; and
   removing an edge portion of the first positive photoresist to a predetermined depth by exposing the first recessed portion to light through the halftone mask.

3. The method of claim 2, the halftone mask including:
   a first portion corresponding to the edge portion of the first positive photoresist, the first portion of the halftone mask transmitting light; and
   a second portion corresponding to a central portion of the first positive photoresist, the second portion of the halftone mask not transmitting light.

4. The method of claim 3, the step of forming an edge portion of the first recessed portion further comprising etching an inside of the first recessed portion in the base member to the predetermined depth.

5. The method of claim 1, the step of forming a first recessed portion comprising:
   forming a first photoresist pattern at the first surface of the base member; and
   etching the first surface of the base member using the first photoresist pattern as a mask.

6. The method of claim 1, the step of forming a second recessed portion comprising:
   forming a second photoresist pattern at the second surface of the base member; and
   etching the second surface of the base member using the second photoresist pattern as a mask.

7. The method of claim 4, further comprising filling the first recessed portion with a second photoresist before the step of communicating the first recessed portion and the second recessed portion.

8. The method of claim 1, further comprising:
forming the base member as a plate, the communicated first recessed portion and second recessed portion of the base member forming a penetration hole through the base member, the penetration hole comprising a first portion adjacent to and in communication with a second portion, the first portion having an internal diameter that narrows in a direction approaching the second portion, and the second portion having a constant internal diameter.

9. The method of claim 8, further comprising forming the base member to have a first planar surface and a second planar surface, the second planar surface being opposite to the first planar surface, an interior wall surface forming the second portion of the penetration hole, the interior wall surface being perpendicular to at least one of the first planar surface and the second planar surface.

10. A method of manufacturing a metal mask, the method comprising:
forming a first recessed portion in a first surface of a base member;
forming an edge portion of the first recessed portion in a constant depth, the step of forming an edge portion comprising:
filling the first recessed portion with a first positive photoresist;
disposing a halftone mask at the first surface of the base member; and
removing an edge portion of the first positive photoresist to a predetermined depth by exposing the first recessed portion to light through the halftone mask;
forming a second recessed portion in a second surface of the base member, the second surface being opposite to the first surface; and
communicating the first recessed portion and the second recessed portion of the base member.

11. The method of claim 10, the halftone mask including:
a first portion corresponding to the edge portion of the first positive photoresist, the first portion of the halftone mask transmitting light; and
a second portion corresponding to a central portion of the first positive photoresist, the second portion of the halftone mask not transmitting light.

12. The method of claim 11, the step of forming an edge portion of the first recessed portion further comprising etching an inside of the first recessed portion in the base member to the predetermined depth.

13. The method of claim 12, further comprising filling the first recessed portion with a second photoresist before the step of communicating the first recessed portion and the second recessed portion.

* * * * *